US012050981B2

(12) United States Patent
Madasu et al.

(10) Patent No.: US 12,050,981 B2
(45) Date of Patent: Jul. 30, 2024

(54) PETROLEUM RESERVOIR BEHAVIOR PREDICTION USING A PROXY FLOW MODEL

(71) Applicant: LANDMARK GRAPHICS CORPORATION, Houston, TX (US)

(72) Inventors: Srinath Madasu, Houston, TX (US); Yevgeniy Zagayevskiy, Houston, TX (US); Terry Wong, Spring, TX (US); Dominic Camilleri, Katy, TX (US); Charles Hai Wang, Houston, TX (US); Courtney Leeann Beck, Houston, TX (US); Hanzi Mao, College Station, TX (US); Hui Dong, Austin, TX (US); Harsh Biren Vora, Houston, TX (US)

(73) Assignee: Landmark Graphics Corporation, Houston, TX (US)

( * ) Notice: Subject to any disclaimer, the term of this patent is extended or adjusted under 35 U.S.C. 154(b) by 882 days.

(21) Appl. No.: 16/981,080

(22) PCT Filed: May 15, 2018

(86) PCT No.: PCT/US2018/032816
§ 371 (c)(1),
(2) Date: Sep. 15, 2020

(87) PCT Pub. No.: WO2019/221717
PCT Pub. Date: Nov. 21, 2019

(65) Prior Publication Data
US 2021/0027144 A1 Jan. 28, 2021

(51) Int. Cl.
*G01V 20/00* (2024.01)
*G06F 30/20* (2020.01)
(Continued)

(52) U.S. Cl.
CPC ............. *G06N 3/045* (2023.01); *G01V 20/00* (2024.01); *G06F 30/20* (2020.01); *G06N 3/08* (2013.01)

(58) Field of Classification Search
CPC .......... G06N 3/045; G06N 3/08; G06F 30/20; G01V 99/005
See application file for complete search history.

(56) References Cited

U.S. PATENT DOCUMENTS

2007/0118346 A1 5/2007 Wen et al.
2010/0198570 A1 8/2010 Sarma et al.
(Continued)

FOREIGN PATENT DOCUMENTS

WO WO-2017188858 A1 11/2017

OTHER PUBLICATIONS

Korean Intellectual Property Office, International Search Report and Written Opinion, PCT/US2018/032816, Feb. 1, 2019, 18 pages, Korea.

*Primary Examiner* — Beau D Spratt
(74) *Attorney, Agent, or Firm* — Michael Jenney; Parker Justiss, P.C.

(57) ABSTRACT

Using production data and a production flow record based on the production data, a deep neural network (DNN) is trained to model a proxy flow simulation of a reservoir. The proxy flow simulation of the reservoir is performed, using an ensemble Kalman filter (EnKF), based on the trained DNN. The EnKF assimilates new data through updating a current ensemble to obtain history matching by minimizing a difference between a predicted production output from the proxy flow simulation and measured production data from a field. Using the updated current ensemble, a second proxy flow simulation of the reservoir is performed based on the trained DNN. The assimilating and the performing are repeated while new data is available for assimilating. Pre-
(Continued)

dicted behavior of the reservoir is determined based on the proxy flow simulation of the reservoir. An indication of the predicted behavior is provided to facilitate production of fluids from the reservoir.

16 Claims, 7 Drawing Sheets

(51) Int. Cl.
  *G06N 3/045* (2023.01)
  *G06N 3/08* (2023.01)

(56) References Cited

U.S. PATENT DOCUMENTS

| | | | |
|---|---|---|---|
| 2012/0265512 A1 | 10/2012 | Hu et al. | |
| 2012/0323544 A1* | 12/2012 | Zhao | E21B 49/00 703/10 |
| 2013/0020131 A1* | 1/2013 | Le Ravalec | E21B 43/30 175/50 |
| 2013/0118736 A1 | 5/2013 | Usadi et al. | |
| 2018/0066515 A1* | 3/2018 | Balan | E21B 43/20 |
| 2018/0258761 A1* | 9/2018 | Babin | G06F 30/20 |
| 2019/0271211 A1* | 9/2019 | Mustapha | G06F 17/11 |
| 2019/0383965 A1* | 12/2019 | Salman | G01V 11/00 |

* cited by examiner

PETROLEUM RESERVOIR BEHAVIOR PREDICTION USING A PROXY FLOW MODEL

CROSS-REFERENCE TO RELATED APPLICATIONS

This application is a U.S. national stage patent application of International Patent Application No. PCT/US2018/032816, filed on May 15, 2018, the benefit of which is claimed and the disclosure of which is incorporated herein by reference in its entirety.

TECHNICAL FIELD

The present description generally relates to predicting a given petroleum reservoir's production, including predicting a given petroleum reservoir's production using, for example, machine learning techniques.

BACKGROUND

Reservoir simulation is an area of reservoir engineering which employs computer models to predict the flow of fluids, such as petroleum, water, and gas, within a reservoir. Reservoir simulators are used by petroleum producers, for example, in determining how best to develop new fields, as well as in generating production forecasts for developed fields on which investment decisions are based.

In one or more implementations, not all of the depicted components in each figure may be required, and one or more implementations may include additional components not shown in a figure. Variations in the arrangement and type of the components may be made without departing from the scope of the subject disclosure. Additional components, different components, or fewer components may be utilized within the scope of the subject disclosure.

DETAILED DESCRIPTION

The detailed description set forth below is intended as a description of various implementations and is not intended to represent the only implementations in which the subject technology may be practiced. As those skilled in the art would realize, the described implementations may be modified in various different ways, all without departing from the scope of the present disclosure. Accordingly, the drawings and description are to be regarded as illustrative in nature and not restrictive.

Data assimilation techniques may be utilized in petroleum engineering where such techniques are also referred to as "history matching," which may involve combining observations with "prior knowledge" (e.g., mathematical representations of mechanistic relationships, numerical models, model output) to obtain an estimate of the state of a system and the uncertainty of that estimate. In an example, data assimilation techniques may be utilized for determining an uncertainty estimate of a prediction of production of wells in petroleum reservoirs and for generating computational models for optimizing decision parameters that may improve oil production.

An ensemble Kalman filter (EnKF) may refer to an effective data assimilation technique, such as for history matching of a petroleum reservoir's production. In an example, the EnKF is able to update both static and dynamic reservoir properties, such as petrophysical properties and oil extraction flow rates, by assimilating data of different kinds coming from various sources. EnKF techniques may be applied on a number of realizations of a petroleum reservoir to update the model during a data assimilation stage and to characterize uncertainty associated with the model. As used herein, a realization refers a set of values for properties at each location within a model of a petroleum reservoir, e.g., corresponding to a volume of interest. The forecast step of EnKF requires performing a flow simulation run for each model realization from current time step to the future time step, such as by using a full physics flow simulator. In an example, the computing time for the flow simulation is usually very high due to the complexity of the petroleum reservoir model to simulate, and the relatively large number of the realizations (e.g., several hundreds) that may be required to be processed as part of the simulation, to ensure a proper relationship between the model parameters for an optimal EnKF update operation. In practice, it therefore may not be feasible to perform so many respective iterations of a flow simulation (e.g., for each number of realizations) with a full physics flow simulator. Although, implementations of the subject technology described herein relate to using the EnKF, it is appreciated that any stochastic statistical technique may be utilized instead of the EnKF and still be within the scope of the subject technology.

Implementations of the subject technology enable substituting the execution of a full physics flow simulator with a proxy model based on machine learning techniques related to a deep neural network (DNN). A deep neural network may be referred to as a network because it can be represented by connecting together different functions. For example, a model of the DNN may be represented as a graph representing how the functions are connected together from an input layer, through one or more hidden layers, and finally to an output layer, and each layer may have one or more nodes.

In an example, the DNN of the subject technology generates dynamic property(s) of a petroleum reservoir model calibrated to the input static parameters of the flow simulator, e.g. permeability field, with low computational requirements. This relationship between static and dynamic parameters allows history matching of production data by tuning static parameters of the reservoir model, such as petrophysical properties.

Although a DNN is discussed for the purposes of explanation, it is appreciated that other machine learning techniques can be utilized as well. Further, it is appreciated that other types of neural networks may be utilized by the subject technology. For example, a convolutional neural network, regulatory feedback network, radial basis function network, recurrent neural network, modular neural network, instantaneously trained neural network, spiking neural network, regulatory feedback network, dynamic neural network, neuro-fuzzy network, compositional pattern-producing network, memory network, and/or any other appropriate type of neural network may be utilized.

Implementations of the subject technology provide a tool for petroleum reservoir engineers and reservoir managers to quickly and accurately predict future reservoir performance along with associated uncertainty and, therefore, to optimize hydrocarbon production in a timely manner. The reservoir performance prediction could be based on any relevant measured data including, but not limited to, historical production well data (oil and gas production rate, water production and injection rate, bottomhole pressure), core samples, well logs, large scale seismic, electromagnetic, and gravimetric surveys conducted repeatedly in the same area over the time. The data assimilation, model update, and prediction of future reservoir performance are executed automatically by the EnKF techniques described herein.

In an example scenario, performing history matching based on a flow simulation of a reservoir model using an existing tool (e.g., one that does not utilize techniques related to EnKF and/or machine learning), executing such a flow simulation may take a longer amount of time. The history matching and reservoir model provided by the EnKF and/or machine learning techniques described herein facilitate improving the production of fluids from a production well of a reservoir, facilitate a determination of whether to perform a drilling operation with respect to the reservoir and/or other operations related to the reservoir (e.g., injection of fluids). The subject technology improves the parameters of an original reservoir model to provide an improved representation of the reservoir model, which may be executed for future time periods to predict future production for the reservoir, either with current operating conditions or with different operating parameters to improve the operation of the reservoir. Additionally, the utilization of EnKF and machine learning techniques for performing history matching potentially decreases an amount of time and/or computational resources for performing history matching.

In an implementation, the proxy model may be based in part on production system data including various measurements collected downhole from a well drilled within a reservoir, e.g., in the form of a production well for an oil and gas reservoir. Further, multiple production wells may be drilled for providing access to the reservoir fluids underground. Measured well data may be collected regularly from each production well to track changing conditions in the reservoir, as will be described in further detail below with respect to a production well example as illustrated in FIG. 1.

Petroleum reservoirs are typically geologically complex and large in size. In order to facilitate making decisions that maximize oil recovery, reservoir models are generated using many details based on different data. In an example, two types of data that are commonly used in reservoir modeling are geologic data and production data. Geologic data, such as seismic and wireline logs, describe earth properties (e.g., porosity) of the reservoir. For comparison, production data (e.g., water saturation and pressure information) relates to the fluid flow dynamics of the reservoir. Both data types therefore may be considered so that the resulting models are more accurate. Based on these models, managers and other personnel can make business decisions that attempt to maximize economic profits and/or minimize operational risks for a given reservoir.

Figure 1:
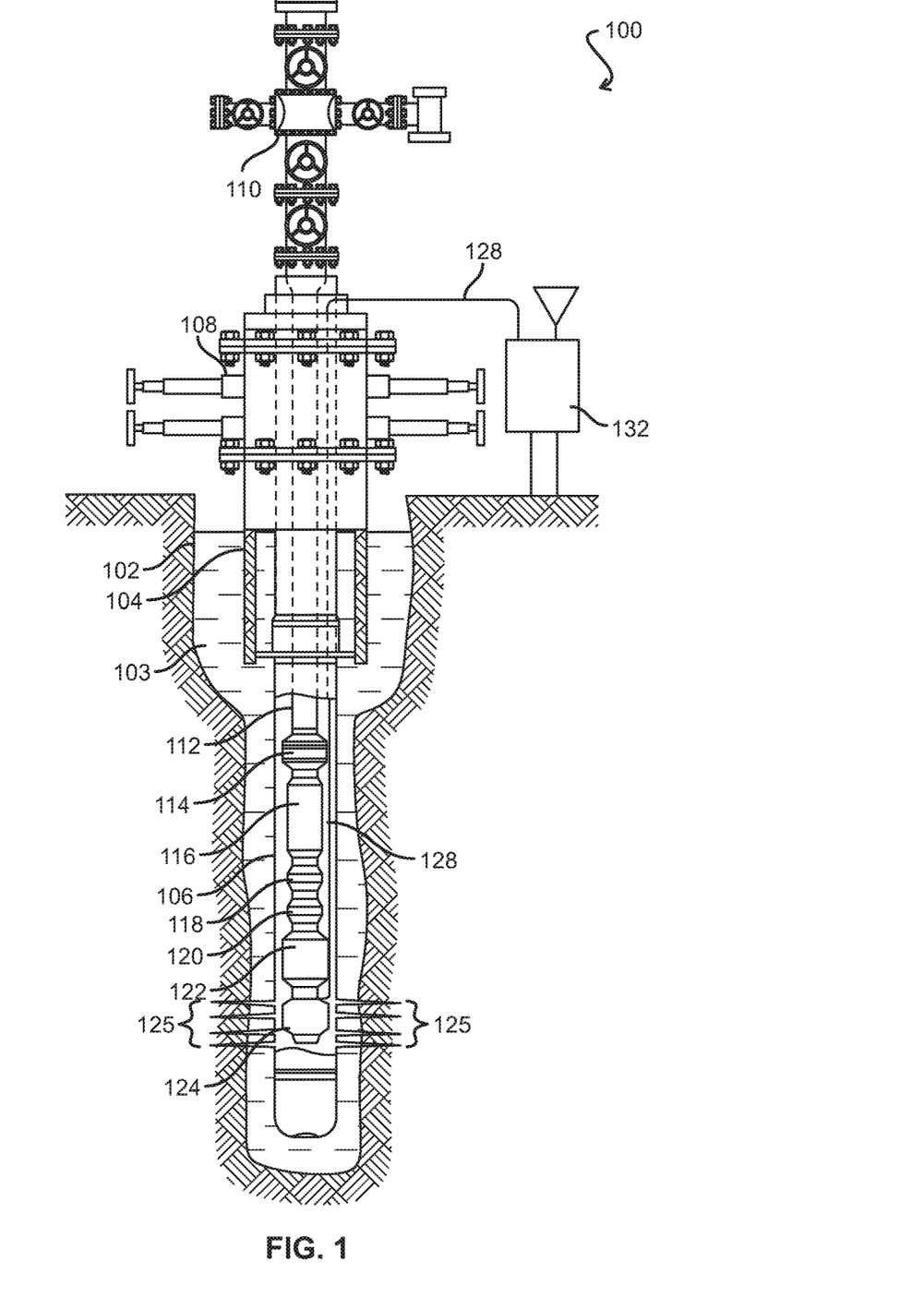
FIG. 1 illustrates an example of a production well suitable for hydrocarbon production and exploration from a subsurface reservoir in accordance with some implementations.

FIG. 1 is a diagram of an exemplary production well 100 with a borehole 102 that has been drilled into a reservoir formation. Borehole 102 may be drilled to any depth and in any direction within the formation. For example, borehole 102 may be drilled to ten thousand feet or more in depth and further, may be steered horizontally for any distance through the formation, as desired for a particular implementation. The production well 100 also includes a casing header 104 and a casing 106, both secured into place by cement 103. A blowout preventer 108 couples to casing header 104 and a production wellhead 110, which together seal in the well head and enable fluids to be extracted from the well in a safe and controlled manner.

Measured well data corresponding to the aforementioned geologic and/or production data may be periodically sampled and collected from the production well 100 and combined with measurements from other wells within a reservoir, enabling the overall state of the reservoir to be monitored and assessed. Such measurements may be taken using a number of different downhole and surface instruments, including but not limited to, a temperature and pressure sensor 118 and a flow meter 120. Additional devices may also be coupled in-line to a production tubing 112 including, for example, a downhole choke 116 (e.g., for varying a level of fluid flow restriction), an electric submersible pump (ESP) 122 (e.g., for drawing in fluid flowing from perforations 125 outside ESP 122 and production tubing 112), an ESP motor 124 (e.g., for driving ESP 122), and a packer 114 (e.g., for isolating the production zone below the packer from the rest of well 100). Additional surface measurement devices may be used to measure, for example, the tubing head pressure and the electrical power consumption of ESP motor 124.

Although various example components of the production well 100 are discussed above, it is appreciated that operations related to measuring well data may apply to other components of the production well 100 than those discussed and/or shown in FIG. 1. For example, measured well data may be provided from components such as a crown block and water table, catline boom and hoist line, drilling line, monkeyboard, traveling block, mast, doghouse, water tank, electric cable tray, engine generator sets, fuel tanks, electric control house, bulk mud components storage, reserve pits, mud gas separator, shale shaker, choke manifold, pipe ramp, pipe racks, accumulator, and/or among other types of components of the production well 100. In implementations described herein, well data may be provided by any of the components described herein in connection with the production well 100.

As shown in FIG. 1, the device along production tubing 112 couples to a cable 128, which may be attached to an exterior portion of production tubing 112. Cable 128 may be used primarily to provide power to the devices to which it couples. Cable 128 also may be used to provide signal paths (e.g., electrical or optical paths), through which control signals may be directed from the surface to the downhole devices as well as telemetry signals from the downhole devices to the surface. The respective control and telemetry signals may be sent and received by a control unit 132 at the surface of the production well. Control unit 132 may be coupled to cable 128 through blowout preventer 108.

In an implementation, field personnel may use control unit 132 to control and monitor the downhole devices locally, e.g., via a user interface provided at a terminal or control panel integrated with control unit 132. Additionally or alternatively, the downhole devices may be controlled and monitored by a remote processing system. Processing system may be used to provide various supervisory control and data acquisition (SCADA) functionality for the production wells associated with each reservoir in a field. For example, a remote operator may use processing system to send appropriate commands for controlling wellsite operations to control unit 132. Communication between control unit 132 and processing system may be via one or more communication networks, e.g., in the form of a wireless network (e.g., a cellular network), a wired network (e.g., a cabled connection to the Internet) or a combination of wireless and wired networks.

In one or more implementations, such a processing system may include a computing device (e.g., a server) and a data storage device (e.g., a database). Such a computing device may be implemented using any type of computing device having at least one processor, a memory and a networking interface capable of sending and receiving data to and from control unit 132 via a communication network, such as a processor 438 described in FIG. 4 and/or the computing device 600 described in FIG. 6.

In an implementation, control unit 132 may periodically send wellsite production data via a communication network to the processing system for processing and storage. Such wellsite production data may include, for example, production system measurements from various downhole devices, as described above. In some implementations, such production data may be sent using a remote terminal unit (RTU) of control unit 132. In an implementation, data storage device 144 may be used to store the production data received from control unit 132. In an example, data storage device 144 may be used to store historical production data including a record of actual and simulated production system measurements obtained or calculated over a period of time, e.g., multiple simulation time-steps, as will be described in further detail below. While the production well 100 is described in the context of a single reservoir, it should be noted that the implementations disclosed herein are not limited thereto and that the disclosed implementations may be applied to fluid production from multiple reservoirs in a multi-reservoir production system.

Though a computer simulation, the integration of production data into a reservoir model may be performed. In an existing approach, multiple computer simulations are performed to identify reservoir models that generate fluid dynamics matching the historical production data, which is also referred to as history matching. Due to the computational complexity and significant duration (e.g., several hours or days) of performing such computer simulations, in some cases only a small number of computer simulations are performed and the results of history matching results may be associated with an amount of uncertainty, which can also introduce other uncertainty into future production forecasts of the reservoir that are performed. Embodiments of the subject technology therefore, in an effort to improve reservoir planning and development decisions, potentially provide improvements in the accuracy of such historical matching results through using EnKF techniques in conjunction with a DNN machine learning model.

In one or more implementations, there are two main improvements for the current petroleum reservoir management process that are associated with the EnKF-based history matching of the subject technology: (i) the history matching of a petroleum reservoir is conducted automatically with EnKF bringing together all available relevant data, and (ii) the application of DNN in an EnKF environment enables performing history matching more quickly, given that the DNN model has been already trained on a separate training data set.

In this manner, implementations of the subject technology provide EnKF-based history matching techniques that utilize a proxy flow simulator based on a DNN model thereby enabling a quicker assimilation of data into the reservoir model and, as a result, providing an improved prediction of the reservoir for future time periods. By using the improved prediction, decisions by personnel regarding management of the reservoir can be made in a more timely manner. A proxy flow simulator, as used herein, relates to a machine learning representation of a full physics flow simulator for a given reservoir model. In an implementation, such a proxy flow simulator behaves and functions similar to a full physics flow simulator but utilizes a DNN model that potentially yields improvements in reducing processing times and/or other computational resources for running a flow simulation of the reservoir model.

Figure 2:
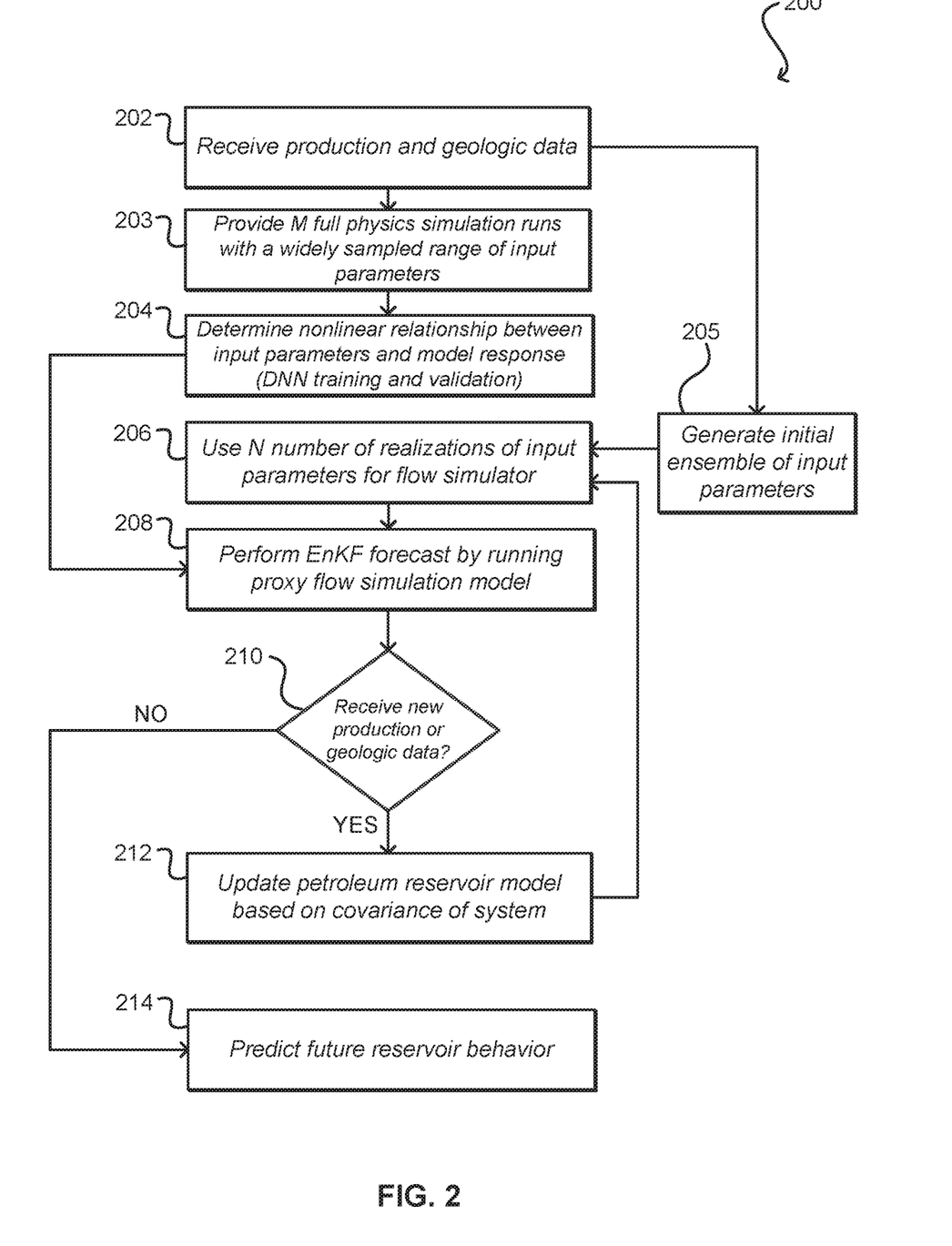
FIG. 2 conceptually illustrates an example flowchart of a process of predicting future reservoir behavior using an ensemble Kalman filter in conjunction with a deep neural network in accordance with some implementations.

FIG. 2 conceptually illustrates an example flowchart of a process 200 of predicting future reservoir behavior using an ensemble Kalman filter in conjunction with a deep neural network in accordance with some implementations. Although this figure, as well as other process illustrations contained in this disclosure may depict functional steps in a particular sequence, the processes are not necessarily limited to the particular order or steps illustrated. The various steps portrayed in this or other figures can be changed, rearranged, performed in parallel or adapted in various ways. Furthermore, it is to be understood that certain steps or sequences of steps can be added to or omitted from the process, without departing from the scope of the various implementations. The process 200 may be implemented by one or more computing devices or systems in some implementations, such as a computing device 600 described in FIG. 6, and/or client device 702 or server 706 described in FIG. 7.

At block 202, initial input data including production data and geologic data related to a reservoir are received. In one or more implementations, production data may include, for example, actual and/or simulated production system measurements, including in some instances a production flow record corresponding to at least a rate of flow (e.g., oil, gas, and/or water) during production of hydrocarbons at the reservoir and/or an amount of hydrocarbons that are produced from the reservoir. Actual production system measurements may include, for example, surface and downhole well measurements from various production wells in the multi-reservoir system. Such measurements may include, but are not limited to, pressure, temperature and fluid flow measurements taken downhole near the well perforations, along the production string, at the wellhead and within the gathering network prior to the point where the fluids mix with fluids from other reservoirs. The simulated measurements may include, for example and without limitation, estimates of pressure, temperature and fluid flow. Such estimates may be determined based on, for example, simulation results from one or more previous time-steps corresponding to prior periods of time.

In one or more implementations, geologic data may be determined from oil well logging that collects information relating to properties of the earth formations traversed by a wellbore for petroleum drilling and production operations. For example, in oil well wireline logging, a probe or "sonde" is lowered into the borehole after some or all of the well has been drilled, and is used to determine certain properties of the formations traversed by the borehole. In an example, geologic data corresponding to various properties of the earth's formations are measured and correlated with the position of the sonde in the borehole, as the sonde is pulled uphole. These properties may be stored in one or more well logs in an example. Such well logs therefore provide geologic data corresponding to petrophysical properties, facies, and other related geologic attributes along the trajectory of the wells. For example, a well log may include geologic data corresponding to at least one petrophysical property (e.g., porosity, lithology, water saturation, permeability, density, oil/water ratio, geochemical information, paled data, etc.) along the trajectory of a given well used for oil well drilling.

In one or more implementations, a deep neural network (DNN) model, corresponding to a proxy flow simulation model, may be trained in the following way as described in the following discussion of blocks 203 and 204. At block 203, an M number of full physics flow simulations are run with various sets of input parameters (e.g., porosity, permeability, and/or a production flow record) and corresponding outputs (e.g., oil production rate, gas production rate, water production rate and/or bottomhole pressure at each well as a function of input parameters and time) are recorded. In an example, this number of full physics flow simulations may be large enough to sample the space of uncertainty as accurately as possible. One hundred flow simulation runs provides a minimal reasonable number in one example. These input and output values are not part of the EnKF ensemble, which may be generated in later steps. Instead, this set of a wide range of input parameters values and corresponding response values may be used as a 'library' to train a DNN-based proxy flow simulation model.

In one or more implementations, relationships between the received geologic data and the production data may be determined during training of the DNN. At block 204, the DNN determines a nonlinear relationship between input parameters and model response by fitting a mathematical model to a training set of the available flow simulation runs, which is a subset of all runs (e.g., approximately 60%-80%). The mathematical model may be represented by a set of weights that are used to weigh nonlinear transform of input parameters as a weighted sum. This weighted sum represents an estimate of the output parameters from the flow simulation runs that should match recorded target output parameters as closely as possible. The remaining set of the flow simulation runs may be utilized for the testing and cross-validation of the trained DNN model. Once the DNN model is deemed to adequately describe relationship between static and dynamic parameters of the particular dynamic system in time, this DNN model is used for the history matching with the EnKF, given that the production configurations do not change on the field (e.g., the number of wells remains the same for future time steps, the production operation stays the same for these wells in future time steps, etc.). The resulting proxy flow simulation model has a form shown in Equation (1) below. Here, the forecasted output parameters $M^f_2$ can be reported at some time step $t_{n+1}$, and are represented as a function $f$ of the updated output parameters $M^u_2$ at time step $t_n$, updated input parameters $M^u_1$ and time component $t_n$.

$$M^f_2(t_{n+1}) = f(M^u_1(t_n), M^u_2(t_n)) \quad (1)$$

At block 205, based at least in part on the received initial input data, an initial ensemble of input parameters is generated for the proxy flow simulation. In an example, the initial ensemble includes an N number of realizations of the input parameters (e.g., petrophysical properties) and may be generated using one or more geostatistical techniques such as sequential Gaussian simulation (SGS) for continuous properties (e.g., porosity, permeability) and sequential indicator simulation (SIS) for categorical properties (e.g., lithological facies). The initial ensemble of input parameters may include respective parameters corresponding to petrophysical properties such as porosity and permeability. These initial parameters are treated as inputs to the flow simulator. In an example, the values of the initial parameters are assumed to not vary in time, but are updated at each data assimilation step. Other examples of initial parameters may be a relative permeability curve, PVT tables, geomechanical properties, etc. In an example, geostatistical techniques enable interpolation of geologic data such that for geologic data corresponding to one or more locations, the geostatistical techniques can provide an interpolated value of the geologic data at a different location.

At block 206, the N number of realizations of input parameters are used for the proxy flow simulation. In an example, the initial ensemble is used as an input to the DNN corresponding to the proxy flow simulation model.

At block 208, an EnKF forecast operation is performed in which the proxy flow simulation model is run N times from time step $t_n$ to $t_{n+1}$. For example, using an ensemble Kalman filter, the proxy flow simulation of the reservoir is performed based on the trained DNN. Each realization from the ensemble of input static parameters, presented in a three-dimensional space, is used as an input parameter in the trained DNN proxy flow simulation model described by Eq. (1) to predict a realization of output parameter values for next time step $t_{n+1}$ from current time step $t_n$. This forecast procedure is repeated for each ensemble member (realization) in the ensemble. In an example, the output of the EnKF forecast operation is an unaltered three-dimensional input model (e.g., a petrophysical model of the reservoir) and corresponding—production rates predicted from time step $t_n$ to $t_{n+1}$.

At block 210, it is determined whether new production and/or geologic data have been received. In an example, the new production and/or geologic data may be received from well log data (or any other source of data) that has been generated since the previous production and/or geologic data was received at block 202. If new production and/or geologic data has not been received, the process 200 may continue to block 214 discussed below.

At block 212, if new production and/or geologic data have been received, an EnKF update operation is performed where the petrophysical model is updated, using the ensemble Kalman filter, based on determining a covariance matrix of the initial input data, the input and output parameters, and/or the new production and/or geologic data. For example, the results of the proxy flow simulation, such as the oil production rate, and the petrophysical model are updated to the data sampled at current time step $t_{n+1}$ based on the covariance matrix of the modeled system. In an example, new production and/or geologic data are assimilated, using the ensemble Kalman filter, by updating a current ensemble to obtain history matching through a minimization of differences between a predicted production output from the proxy flow simulation and measured production data from a field, in which the field may include one or more reservoirs in a given geographic area and/or region. Equation (2) below shows how the update is made. In an example, $M_{12}$ is the entire ensemble in a matrix form both consisting of static parameters $M_1$, e.g., petrophysical model, and dynamic variables $M^2$, e.g., oil production rate, as depicted in Equation (3) below; superscripts $f$, u and a denote forecasted model from Equation (1), updated model, and actual (true) model; $K(t_{n+1})$ is the Kalman gain, which is computed from the modeled system covariance $C_{12}(t_{n+1})$ and data measurement error covariance $\varepsilon(t_{n+1})$ according to Equation (4) below; the covariance between model variable $M_{12}(t_{n+1})_i$ and model variable $M_{12}(t_{n+1})_j$ is computed as in Equation (5) below with r being a realization index and N is the ensemble size or total number of realizations, $<...>$ is the average operator shown in Equation (6) below; $D_{12}(t_{n+1})$ is the data sampled at time step $t_{n+1}$ both for static $M_1$ and dynamic $M_2$ variables; and $H(t_{n+1})$ is the observation matrix of 0s and 1s that relate actual, sought-after, model $M_{12}^a(t_{n+1})$ and the data values $D_{12}(t_{n+1})$ in the matrix notation for current time step $t_{n+1}$ as shown in Equation (7) below.

$$M_{12}^u(t_{n+1}) = M_{12}^f(t_{n+1}) + K(t_{n+1}) * (D_{12}(t_{n+1}) - H(t_{n+1}) * M_{12}^f(t_{n+1})) \quad (2)$$

$$M_{12} \in M_1 \cup M_2 \quad (3)$$

$$K(t_{n+1}) = C_{12}(t_{n+1}) * H^T(t_{n+1}) * (H(t_{n+1}) * C_{12}(t_{n+1}) * H^T(t_{n+1}) + \varepsilon(t_{n+1}))^{-1} \quad (4)$$

$$C_{12}(t_{n+1})_{i,j} = \Sigma_{r=1}^N (M_{12}(t_{n+1})_{i,r} - <M_{12}(t_{n+1})_i>) * (M_{12}(t_{n+1})_{j,r} - <M_{12}(t_{n+1})_j>)/(N-1) \quad (5)$$

$$<M_{12}(t_{n+1})_i> = \Sigma_{r=1}^N M_{12}(t_{n+1})_{i,r}/N \quad (6)$$

$$D_{12}(t_{n+1}) = H(t_{n+1}) * M_{12}^a(t_{n+1}) \quad (7)$$

The process 200 may then repeat the operation at block 206 by performing, using the ensemble Kalman filter, the proxy flow simulation of the reservoir based on the trained DNN and the updated petrophysical model, and repeat the operation at block 208 by running the proxy flow simulation model at block 208 to predict production parameters for the next time step $t_{n+2}$ using Equation (1). These operations may be repeated until all data are assimilated into the system (e.g., while new data is available for assimilating). In an example, using the updated current ensemble (mentioned above), a second proxy flow simulation of the reservoir is performed based on the trained DNN.

At block 214, based at least in part on the performed proxy flow simulation of the reservoir, future behavior of the reservoir related to at least a future oil production rate of the reservoir is predicted. In an example, a predicted future behavior of the reservoir is determined based at least on the performed proxy flow simulation of the reservoir.

Figure 3:
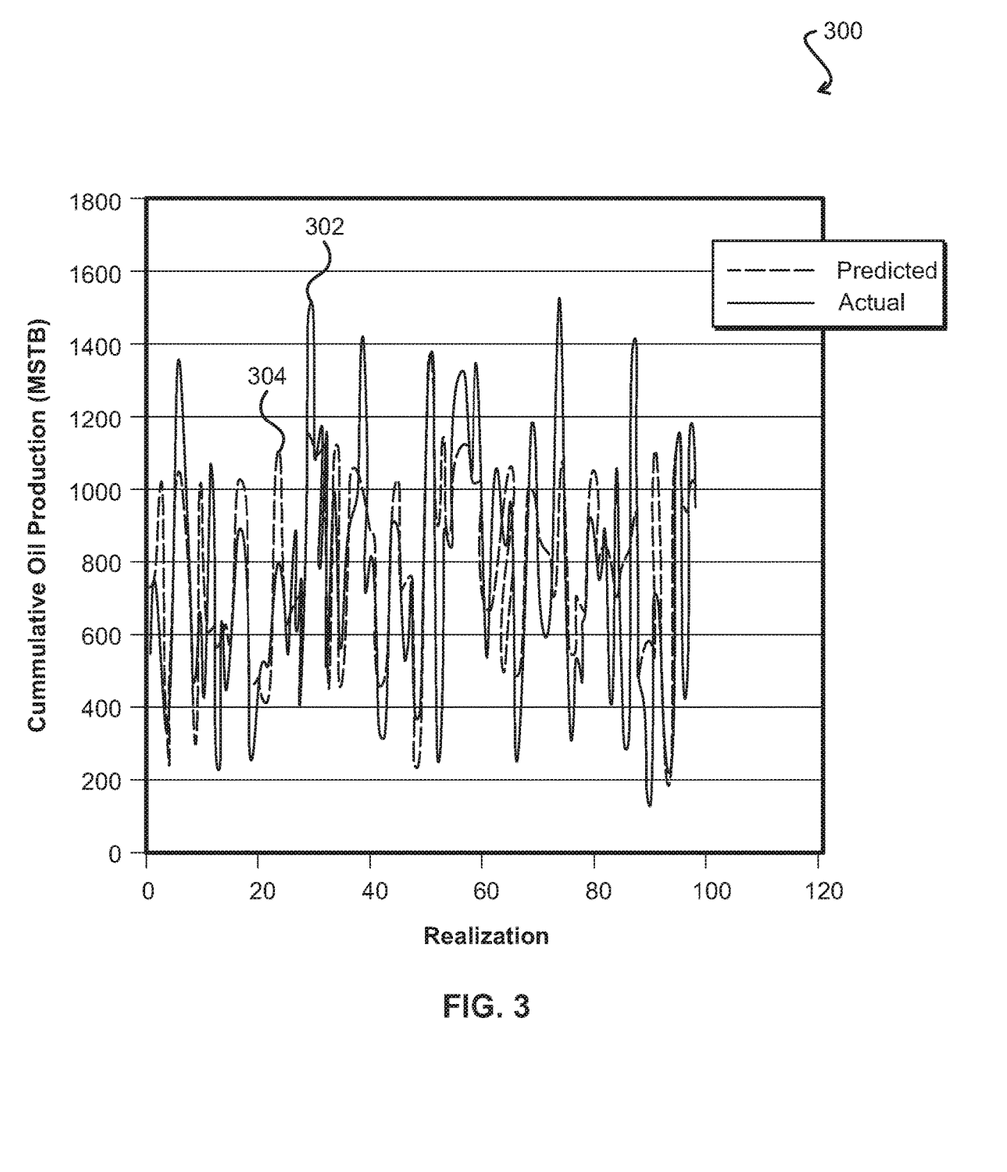
FIG. 3 illustrates a plot of an example of a comparison of the predicted cumulative oil production to the actual production data using multi-layer neural network in accordance with some implementations.

FIG. 3 illustrates a plot 300 of an example of a comparison of the predicted cumulative oil production to the actual production data using multi-layer neural network for an ensemble size where N=100.

FIG. 3 shows the comparison between the predicted (e.g., line 302) and actual (e.g., line 304) cumulative oil production rate at some time step t for all one hundred realizations using multi-layer neural network. In the example of FIG. 3, the plot 300 corresponds to four production wells placed at the corners of a two-dimensional model with a single injection well located in the middle of the grid. The inputs to the DNN for each realization and time step are the permeability averaged over the grid, variance of permeability, bottom hole injector pressure, bottom hole producer pressure, and cumulative water injection. The neural network includes three layers with eighteen, twenty, and twenty neural nodes per layer, respectively. The rectified linear unit is used as the activation function in this example. The predicted cumulative oil production values closely follow the actual values, which are obtained from a full physics flow simulator.

Figure 4:
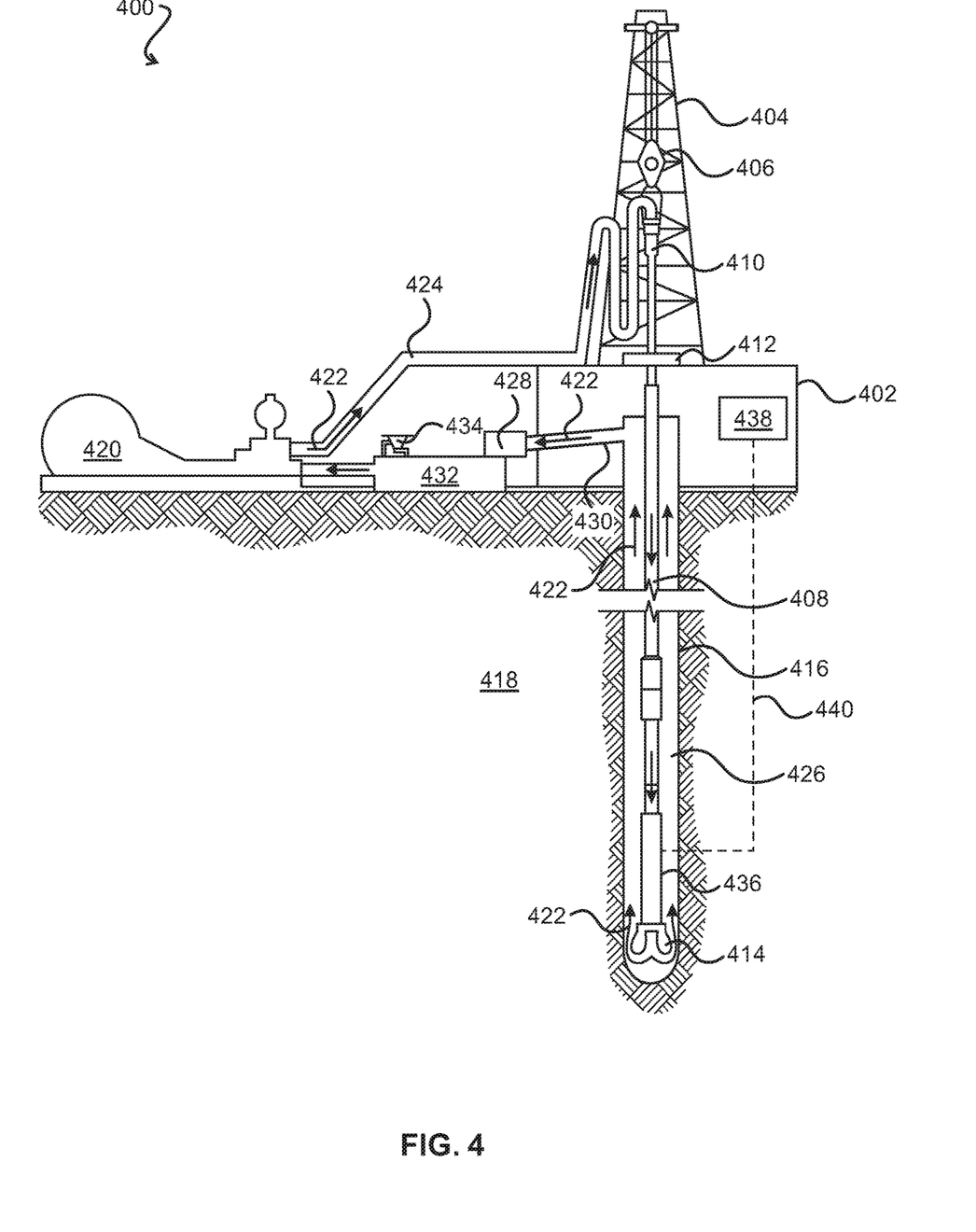
FIG. 4 illustrates an exemplary drilling assembly for implementing the processes described herein in accordance with some implementations.
Figure 5:
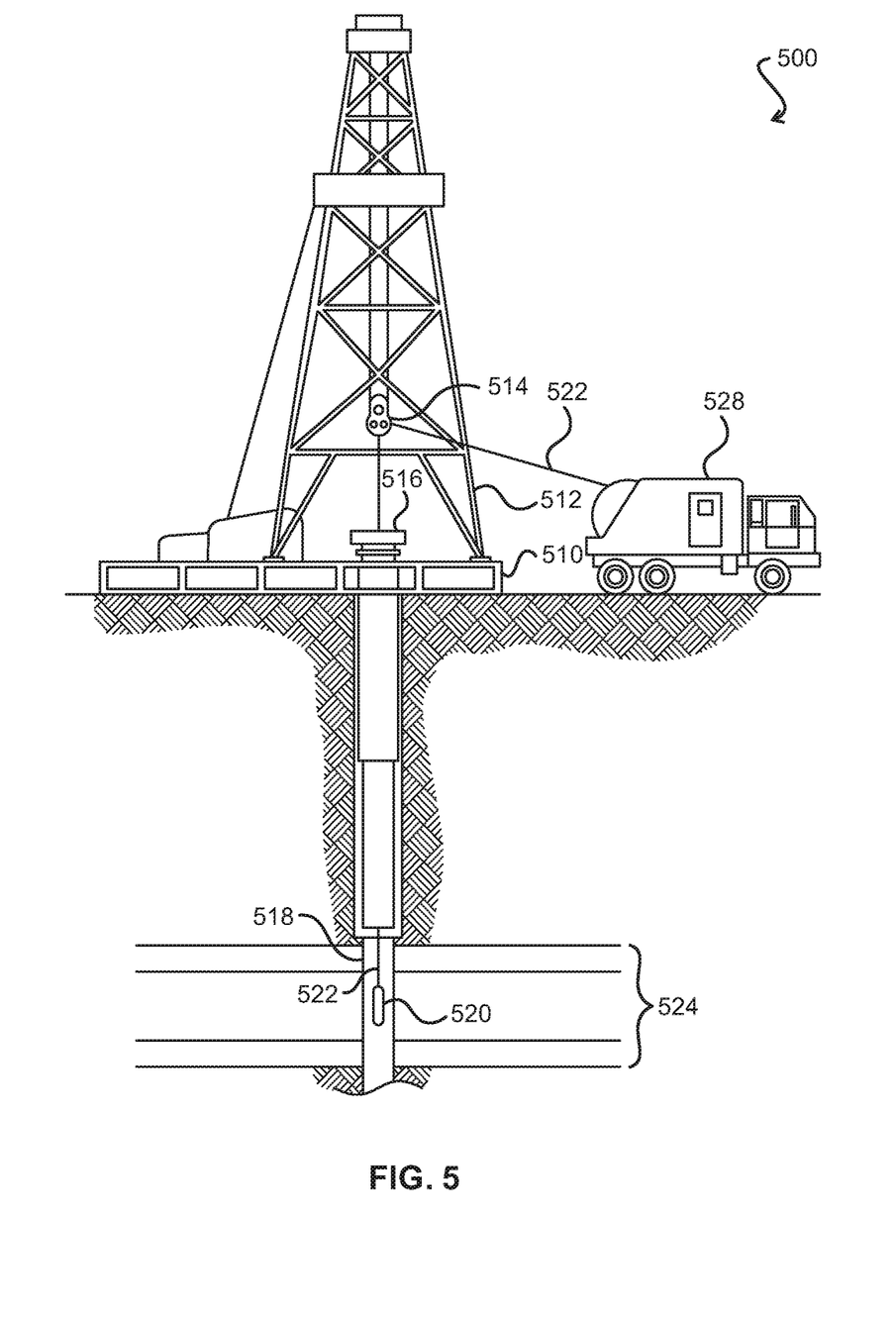
FIG. 5 illustrates a wireline system suitable for implementing the processes described herein in accordance with some implementations.

The following discussion in FIGS. 4 and 5 relate to examples of a drilling assembly and logging assembly for a given oil or gas well system that may be utilized to implement the techniques based on using the ensemble Kalman filter in conjunction with the deep neural network that may be applied to drilling and/or logging scenarios as described above.

Oil and gas hydrocarbons can naturally occur in some subterranean formations. In the oil and gas industry, a subterranean formation containing oil, gas, or water is referred to as a reservoir. A reservoir may be located under land or off shore. Reservoirs are typically located in the range of a few hundred feet (shallow reservoirs) to a few tens of thousands of feet (ultra-deep reservoirs). In order to produce oil or gas, a wellbore is drilled into a reservoir or adjacent to a reservoir. The oil, gas, or water produced from the wellbore is called a reservoir fluid. An oil or gas well system can be on land or offshore.

FIG. 4 illustrates an exemplary drilling assembly 400 for implementing the processes described herein. It should be noted that while FIG. 4 generally depicts a land-based drilling assembly, those skilled in the art will readily recognize that the principles described herein are equally applicable to subsea drilling operations that employ floating or sea-based platforms and rigs, without departing from the scope of the disclosure.

In one or more implementations, the process 200 described above begins after the drilling assembly 400 drills a wellbore 416 penetrating a subterranean formation 418. It is appreciated, however, that any processing performed in the process 200 by any appropriate component described herein may occur only uphole, only downhole, or at least some of both (i.e., distributed processing). As illustrated, the drilling assembly 400 may include a drilling platform 402 that supports a derrick 404 having a traveling block 406 for raising and lowering a drill string 408. The drill string 408 may include, but is not limited to, drill pipe and coiled tubing, as generally known to those skilled in the art. A kelly 410 supports the drill string 408 as it is lowered through a rotary table 412. A drill bit 414 is attached to the distal end of the drill string 408 and is driven either by a downhole motor and/or via rotation of the drill string 408 from the well surface. As the drill bit 414 rotates, it creates the wellbore 416 that penetrates various subterranean formations 418.

A pump 420 (e.g., a mud pump) circulates drilling mud 422 through a feed pipe 424 and to the kelly 410, which conveys the drilling mud 422 downhole through the interior of the drill string 408 and through one or more orifices in the drill bit 414. The drilling mud 422 is then circulated back to the surface via an annulus 426 defined between the drill string 408 and the walls of the wellbore 416. At the surface, the recirculated or spent drilling mud 422 exits the annulus 426 and may be conveyed to one or more fluid processing unit(s) 428 via an interconnecting flow line 430. After passing through the fluid processing unit(s) 428, a "cleaned" drilling mud 422 is deposited into a nearby retention pit 432 (i.e., a mud pit). While illustrated as being arranged at the outlet of the wellbore 416 via the annulus 426, those skilled in the art will readily appreciate that the fluid processing unit(s) 428 may be arranged at any other location in the drilling assembly 400 to facilitate its proper function, without departing from the scope of the scope of the disclosure.

Chemicals, fluids, additives, and the like may be added to the drilling mud 422 via a mixing hopper 434 communicably coupled to or otherwise in fluid communication with the retention pit 432. The mixing hopper 434 may include, but is not limited to, mixers and related mixing equipment known to those skilled in the art. In other implementations, however, the chemicals, fluids, additives, and the like may be added to the drilling mud 422 at any other location in the drilling assembly 400. In at least one implementation, for example, there may be more than one retention pit 432, such as multiple retention pits 432 in series. Moreover, the retention pit 432 may be representative of one or more fluid storage facilities and/or units where the chemicals, fluids, additives, and the like may be stored, reconditioned, and/or regulated until added to the drilling mud 422.

The processor 438 may be a portion of computer hardware used to implement the various illustrative blocks, modules, elements, components, methods, and algorithms described herein. The processor 438 may be configured to execute one or more sequences of instructions, programming stances, or code stored on a non-transitory, computer-readable medium. The processor 438 can be, for example, a general purpose microprocessor, a microcontroller, a digital signal processor, an application specific integrated circuit, a field programmable gate array, a programmable logic device, a controller, a state machine, a gated logic, discrete hardware components, an artificial neural network, or any like suitable entity that can perform calculations or other manipulations of data. In some implementations, computer hardware can further include elements such as, for example, a memory (e.g., random access memory (RAM), flash memory, read only memory (ROM), programmable read only memory (PROM), erasable programmable read only memory (EPROM)), registers, hard disks, removable disks, CD-ROMs, DVDs, or any other like suitable storage device or medium.

Executable sequences described herein can be implemented with one or more sequences of code contained in a memory. In some implementations, such code can be read into the memory from another machine-readable medium. Execution of the sequences of instructions contained in the memory can cause a processor 438 to perform the process steps described herein. One or more processors 438 in a multi-processing arrangement can also be employed to execute instruction sequences in the memory. In addition, hard-wired circuitry can be used in place of or in combination with software instructions to implement various implementations described herein. Thus, the present implementations are not limited to any specific combination of hardware and/or software.

As used herein, a machine-readable medium will refer to any medium that directly or indirectly provides instructions to the processor 438 for execution. A machine-readable medium can take on many forms including, for example, non-volatile media, volatile media, and transmission media. Non-volatile media can include, for example, optical and magnetic disks. Volatile media can include, for example, dynamic memory. Transmission media can include, for example, coaxial cables, wire, fiber optics, and wires that form a bus. Common forms of machine-readable media can include, for example, floppy disks, flexible disks, hard disks, magnetic tapes, other like magnetic media, CD-ROMs, DVDs, other like optical media, punch cards, paper tapes and like physical media with patterned holes, RAM, ROM, PROM, EPROM and flash EPROM.

The drilling assembly 400 may further include a bottom hole assembly (BHA) coupled to the drill string 408 near the drill bit 414. The BHA may comprise various downhole measurement tools such as, but not limited to, measurement-while-drilling (MWD) and logging-while-drilling (LWD) tools, which may be configured to take downhole and/or uphole measurements of the surrounding subterranean formations 418. Along the drill string 408, logging while drilling (LWD) or measuring while drilling (MWD) equipment 436 is included. In one or more implementations, the drilling assembly 400 involves drilling the wellbore 416 while the logging measurements are made with the LWD/MWD equipment 436. More generally, the methods described herein involve introducing a logging tool into the wellbore that is capable of determining wellbore parameters, including mechanical properties of the formation. The logging tool may be an LWD logging tool, a MWD logging tool, a wireline logging tool, slickline logging tool, and the like. Further, it is understood that any processing performed by the logging tool may occur only uphole, only downhole, or at least some of both (i.e., distributed processing).

According to the present disclosure, the LWD/MWD equipment 436 may include a stationary acoustic sensor and a moving acoustic sensor used to detect the flow of fluid flowing into and/or adjacent the wellbore 416. In an example, the stationary acoustic sensor may be arranged about the longitudinal axis of the LWD/MWD equipment 436, and, thus, of the wellbore 416 at a predetermined fixed location within the wellbore 416. The moving acoustic sensor may be arranged about the longitudinal axis of the LWD/MWD equipment 436, and, thus, of the wellbore 416, and is configured to move along the longitudinal axis of the wellbore 416. However, the arrangement of the stationary acoustic sensor and the moving acoustic sensor is not limited thereto and the acoustic sensors may be arranged in any configuration as required by the application and design.

The LWD/MWD equipment 436 may transmit the measured data to a processor 438 at the surface wired or wirelessly. Transmission of the data is generally illustrated at line 440 to demonstrate communicable coupling between the processor 438 and the LWD/MWD equipment 436 and does not necessarily indicate the path to which communication is achieved. The stationary acoustic sensor and the moving acoustic sensor may be communicably coupled to the line 440 used to transfer measurements and signals from the BHA to the processor 438 that processes the acoustic measurements and signals received by acoustic sensors (e.g., stationary acoustic sensor, moving acoustic sensor) and/or controls the operation of the BHA. In the subject technology, the LWD/MWD equipment 436 may be capable of logging analysis of the subterranean formation 418 proximal to the wellbore 416.

In some implementations, part of the processing may be performed by a telemetry module (not shown) in combination with the processor 438. For example, the telemetry module may pre-process the individual sensor signals (e.g., through signal conditioning, filtering, and/or noise cancellation) and transmit them to a surface data processing system (e.g., the processor 438) for further processing. It is appreciated that any processing performed by the telemetry module may occur only uphole, only downhole, or at least some of both (i.e., distributed processing).

In various implementations, the processed acoustic signals are evaluated in conjunction with measurements from other sensors (e.g., temperature and surface well pressure measurements) to evaluate flow conditions and overall well integrity. The telemetry module may encompass any known means of downhole communication including, but not limited to, a mud pulse telemetry system, an acoustic telemetry system, a wired communications system, a wireless communications system, or any combination thereof. In certain implementations, some or all of the measurements taken by the stationary acoustic sensor and the moving acoustic sensor may also be stored within a memory associated with the acoustic sensors or the telemetry module for later retrieval at the surface upon retracting the drill string 408.

FIG. 5 illustrates a logging assembly 500 having a wireline system suitable for implementing the methods described herein. As illustrated, a platform 510 may be equipped with a derrick 512 that supports a hoist 514. Drilling oil and gas wells, for example, are commonly carried out using a string of drill pipes connected together so as to form a drilling string that is lowered through a rotary table 516 into a wellbore 518. Here, it is assumed that the drilling string has been temporarily removed from the wellbore 518 to allow a logging tool 520 (and/or any other appropriate wireline tool) to be lowered by wireline 522, slickline, coiled tubing, pipe, downhole tractor, logging cable, and/or any other appropriate physical structure or conveyance extending downhole from the surface into the wellbore 518. Typically, the logging tool 520 is lowered to a region of interest and subsequently pulled upward at a substantially constant speed. During the upward trip, instruments included in the logging tool 520 may be used to perform measurements on the subterranean formation 524 adjacent the wellbore 518 as the logging tool 520 passes by. Further, it is understood that any processing performed by the logging tool 520 may occur only uphole, only downhole, or at least some of both (i.e., distributed processing).

The logging tool 520 may include one or more wireline instrument(s) that may be suspended into the wellbore 518 by the wireline 522. The wireline instrument(s) may include the stationary acoustic sensor and the moving acoustic sensor, which may be communicably coupled to the wireline 522. The wireline 522 may include conductors for transporting power to the wireline instrument and also facilitate communication between the surface and the wireline instrument. The logging tool 520 may include a mechanical component for causing movement of the moving acoustic sensor. In some implementations, the mechanical component may need to be calibrated to provide a more accurate mechanical motion when the moving acoustic sensor is being repositioned along the longitudinal axis of the wellbore 518.

The acoustic sensors (e.g., the stationary acoustic sensor, the moving acoustic sensor may include electronic sensors, such as hydrophones, piezoelectric sensors, piezoresistive sensors, electromagnetic sensors, accelerometers, or the like. In other implementations, the acoustic sensors may comprise fiber optic sensors, such as point sensors (e.g., fiber Bragg gratings, etc.) distributed at desired or predetermined locations along the length of an optical fiber. In yet other implementations, the acoustic sensors may comprise distributed acoustic sensors, which may also use optical fibers and permit a distributed measurement of local acoustics at any given point along the fiber. In still other implementations, the acoustic sensors may include optical accelerometers or optical hydrophones that have fiber optic cablings.

Additionally or alternatively, in an example (not explicitly illustrated), the acoustic sensors may be attached to or embedded within the one or more strings of casing lining the wellbore 518 and/or the wall of the wellbore 518 at an axially spaced pre-determined distance.

A logging facility 528, shown in FIG. 5 as a truck, may collect measurements from the acoustic sensors (e.g., the stationary acoustic sensor, the moving acoustic sensor), and may include the processor 438 for controlling, processing, storing, and/or visualizing the measurements gathered by the acoustic sensors. The processor 438 may be communicably coupled to the wireline instrument(s) by way of the wireline 522. Alternatively, the measurements gathered by the logging tool 520 may be transmitted (wired or wirelessly) or physically delivered to computing facilities off-site where the methods and processes described herein may be implemented.

Figure 6:
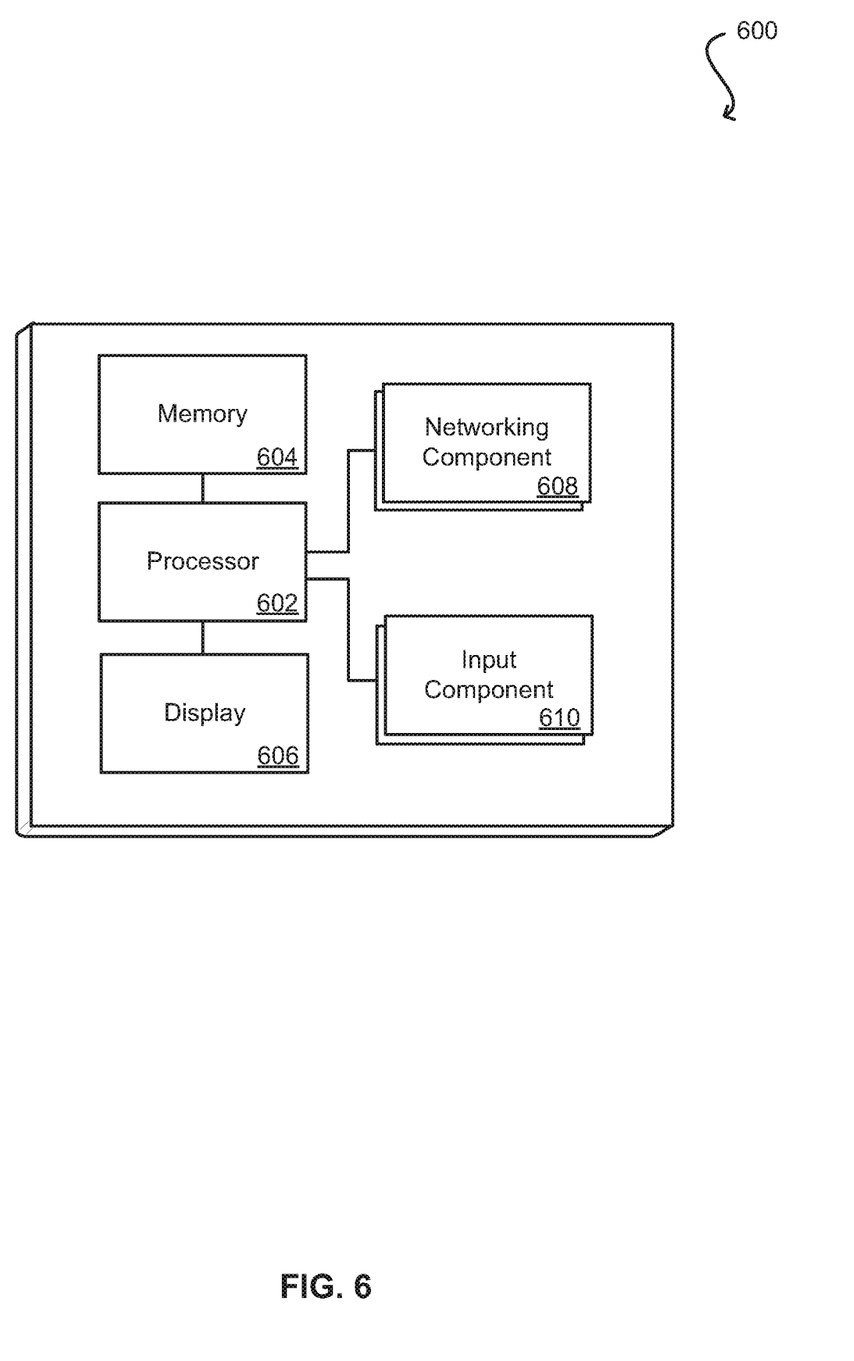
FIG. 6 illustrates a schematic diagram of a set of general components of an example computing device in accordance with some implementations.

FIG. 6 illustrates a schematic diagram of a set of general components of an example computing device 600. In this example, the computing device 600 includes a processor 602 for executing instructions that can be stored in a memory device or element 604. The computing device 600 can include many types of memory, data storage, or non-transitory computer-readable storage media, such as a first data storage for program instructions for execution by the processor 602, a separate storage for images or data, a removable memory for sharing information with other devices, etc.

The computing device 600 typically may include some type of display element 606, such as a touch screen or liquid crystal display (LCD). As discussed, the computing device 600 in many embodiments will include at least one input element 610 able to receive conventional input from a user. This conventional input can include, for example, a push button, touch pad, touch screen, wheel, joystick, keyboard, mouse, keypad, or any other such device or element whereby a user can input a command to the device. In some embodiments, however, such the computing device 600 might not include any buttons at all, and might be controlled only through a combination of visual and audio commands, such that a user can control the computing device 600 without having to be in contact with the computing device 600. In some embodiments, the computing device 600 of FIG. 6 can include one or more network interface elements 608 for communicating over various networks, such as a Wi-Fi, Bluetooth, RF, wired, or wireless communication systems. The computing device 600 in many embodiments can communicate with a network, such as the Internet, and may be able to communicate with other such computing devices.

Figure 7:
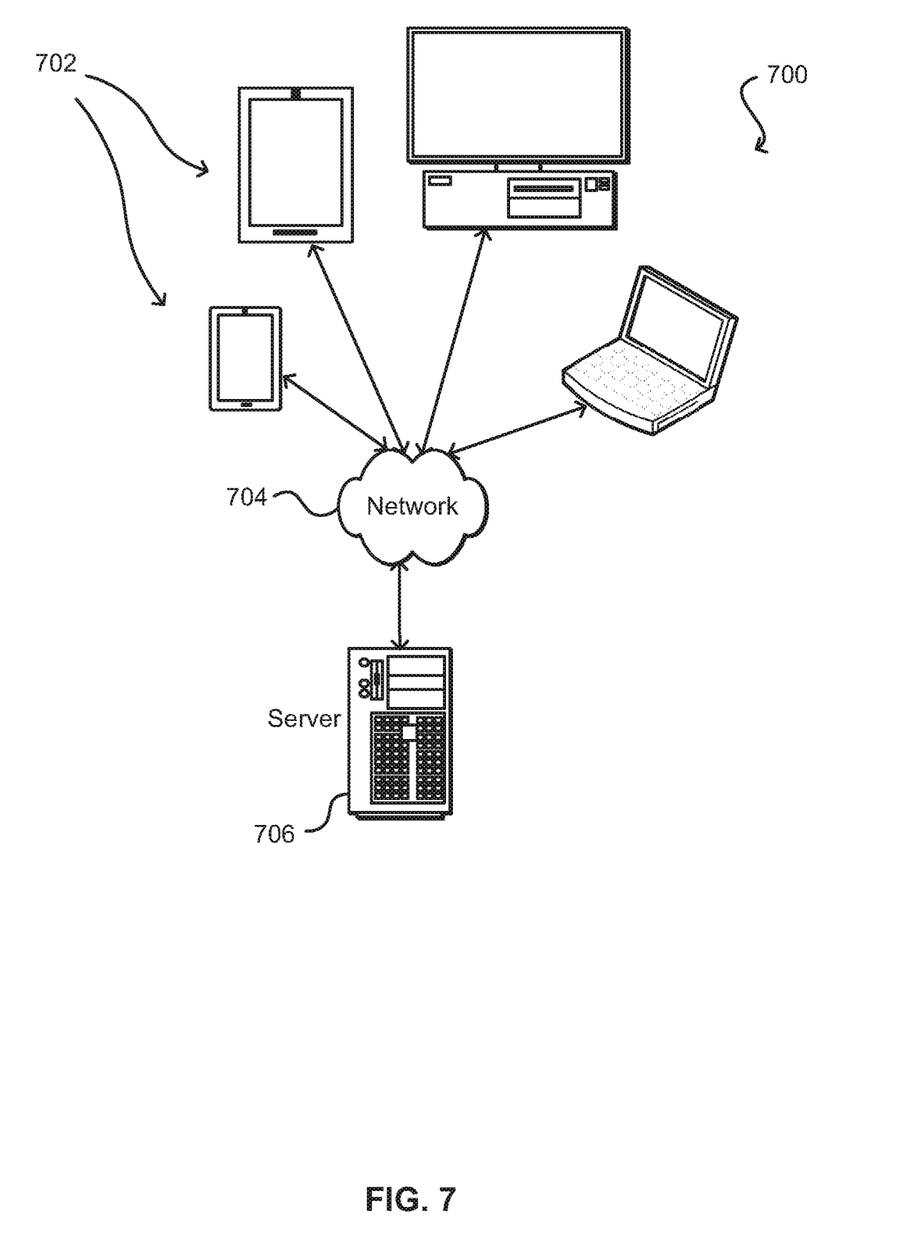
FIG. 7 illustrates a schematic diagram of an example of an environment for implementing aspects in accordance with some implementations.

As discussed herein, different approaches can be implemented in various environments in accordance with the described embodiments. For example, FIG. 7 illustrates a schematic diagram of an example of an environment 700 for implementing aspects in accordance with various embodiments. As will be appreciated, although a client-server based environment is used for purposes of explanation, different environments may be used, as appropriate, to implement various embodiments. The system includes an electronic client device 702, which can include any appropriate device operable to send and receive requests, messages or information over an appropriate network 704 and convey information back to a user of the device. Examples of such client devices include personal computers, cell phones, handheld messaging devices, laptop computers, set-top boxes, personal data assistants, electronic book readers and the like.

The network 704 can include any appropriate network, including an intranet, the Internet, a cellular network, a local area network or any other such network or combination thereof. The network 704 could be a "push" network, a "pull" network, or a combination thereof. In a "push" network, one or more of the servers push out data to the client device. In a "pull" network, one or more of the servers send data to the client device upon request for the data by the client device. Components used for such a system can depend at least in part upon the type of network and/or environment selected. Protocols and components for communicating via such a network are well known and will not be discussed herein in detail. Computing over the network 704 can be enabled via wired or wireless connections and combinations thereof. In this example, the network includes the Internet, as the environment includes a server 706 for receiving requests and serving content in response thereto, although for other networks, an alternative device serving a similar purpose could be used, as would be apparent to one of ordinary skill in the art.

The client device 702 may represent the computing device 600 of FIG. 6, and the server 706 may represent off-site computing facilities in other implementations.

The server 706 typically will include an operating system that provides executable program instructions for the general administration and operation of that server and typically will include computer-readable medium storing instructions that, when executed by a processor of the server, allow the server to perform its intended functions. Suitable implementations for the operating system and general functionality of the servers are known or commercially available and are readily implemented by persons having ordinary skill in the art, particularly in light of the disclosure herein.

The environment in one embodiment is a distributed computing environment utilizing several computer systems and components that are interconnected via computing links, using one or more computer networks or direct connections. However, it will be appreciated by those of ordinary skill in the art that such a system could operate equally well in a system having fewer or a greater number of components than are illustrated in FIG. 7. Thus, the depiction of the environment 700 in FIG. 7 should be taken as being illustrative in nature and not limiting to the scope of the disclosure.

Storage media and other non-transitory computer readable media for containing code, or portions of code, can include any appropriate storage media used in the art, such as but not limited to volatile and non-volatile, removable and non-removable media implemented in any method or technology for storage of information such as computer readable instructions, data structures, program modules, or other data, including RAM, ROM, EEPROM, flash memory or other memory technology, CD-ROM, digital versatile disk (DVD) or other optical storage, magnetic cassettes, magnetic tape, magnetic disk storage or other magnetic storage devices, or any other medium which can be used to store the desired information and which can be accessed by the a system device. Based on the disclosure and teachings provided herein, a person of ordinary skill in the art will appreciate other ways and/or methods to implement the various implementations.

Further Considerations

Various examples of aspects of the disclosure are described below as clauses for convenience. The methods of any preceding paragraph, either alone or in combination may further include the following clauses. These are provided as examples, and do not limit the subject technology.

Clause 1. A method comprising: receiving initial input data comprising at least one of production data or geologic data related to a reservoir; training, using at least the initial input data and a production flow record based on the production data, a deep neural network (DNN) to model a proxy flow simulation of the reservoir; performing, using an ensemble Kalman filter, the proxy flow simulation of the reservoir based on the trained DNN; assimilating new data, using the ensemble Kalman filter, by updating a current ensemble to obtain history matching through a minimization of differences between a predicted production output from the proxy flow simulation and measured production data from a field; performing, using the updated current ensemble, a second proxy flow simulation of the reservoir based on the trained DNN; repeating the assimilating and the performing while new data is available for assimilating; determining a predicted behavior of the reservoir based at least on the performed proxy flow simulation of the reservoir; and providing an indication of the predicted behavior to facilitate production of fluids from the reservoir.

Clause 2. The method of Clause 1, wherein performing, using the ensemble Kalman filter, the proxy flow simulation of the reservoir includes performing a forecast operation of the ensemble Kalman filter.

Clause 3. The method of Clause 1, further comprising: generating, based at least in part on the received initial input data, an initial ensemble of input parameters for the proxy flow simulation, wherein the initial ensemble includes a number of realizations of the input parameters.

Clause 4. The method of Clause 3, wherein the initial ensemble of input parameters comprises parameters corresponding to petrophysical properties of porosity and permeability.

Clause 5. The method of Clause 3, wherein the initial ensemble is generated using a geostatistical technique.

Clause 6. The method of Clause 3, wherein the initial ensemble is used as an input to the DNN.

Clause 7. The method of Clause 3, wherein the proxy flow simulation based on the DNN is performed for each realization of the initial ensemble to forecast production parameters from a previous time step $t_{n-1}$ to a current tune step $t_n$.

Clause 8. The method of Clause 1, wherein performing the proxy flow simulation of the reservoir provides, as output, production rates and a petrophysical model.

Clause 9. The method of Clause 8, further comprising: receiving new input data including new production data and new geologic data; updating, using the ensemble Kalman filter, the petrophysical model based a covariance matrix; and performing, using the ensemble Kalman filter, the proxy flow simulation of the reservoir based on the trained DNN and the updated petrophysical model.

Clause 10. The method of Clause 9, wherein determining the predicted behavior of the reservoir is based at least in part on the updated petrophysical model, and the predicted behavior of the reservoir predicts future oil production rate of the reservoir to facilitate management of oil production from a production well at the reservoir.

Clause 11. A system comprising: a processor; and a memory device including instructions that, when executed by the processor, cause the processor to: receive initial input data comprising at least one of production data or geologic data; train, using at least the initial input data and a production flow record based on the production data, a deep neural network (DNN) to model a proxy flow simulation of a reservoir; perform, using an ensemble Kalman filter, the proxy flow simulation of the reservoir based on the trained DNN; determine a predicted behavior of the reservoir based at least on the performed proxy flow simulation of the reservoir; and provide an indication of the predicted behavior to facilitate production of fluids from the reservoir.

Clause 12. The system of Clause 11, wherein to performing, using the ensemble Kalman filter, the proxy flow simulation of the reservoir includes performing a forecast operation of the ensemble Kalman filter.

Clause 13. The system of Clause 11, wherein the instructions further cause the processor to: generate, based at least in part on the received initial input data, an initial ensemble of input parameters for the proxy flow simulation, wherein the initial ensemble includes a number of realizations of the input parameters.

Clause 14. The system of Clause 13, wherein initial ensemble of input parameters comprises parameters corresponding to petrophysical properties of porosity and permeability.

Clause 15. The system of Clause 13, wherein the initial ensemble is generated using a geostatistical technique.

Clause 16. The system of Clause 13, wherein the initial ensemble is used as an input to the DNN.

Clause 17. The system of Clause 13, wherein the proxy flow simulation based on DNN is performed for each realization of the initial ensemble to forecast production parameters from a previous time step $t_{n-1}$ to a current time step $t_n$.

Clause 18. The system of Clause 11, wherein to perform the proxy flow simulation of the reservoir provides, as output, production rates and a petrophysical model.

Clause 19. The system of Clause 18, wherein the instructions further cause the processor to: receive new input data including new production data and new geologic data; update, using the ensemble Kalman filter, the petrophysical model based a covariance matrix; and perform, using the ensemble Kalman filter, the proxy flow simulation of the reservoir based on the trained DNN and the updated petrophysical model.

Clause 20. A non-transitory computer-readable medium including instructions stored therein that, when executed by at least one computing device, cause the at least one computing device to perform operations comprising: receiving initial input data comprising at least one of production data or geologic data; training, using at least the initial input data, a deep neural network (DNN) to model a proxy flow simulation of a reservoir; performing, using an ensemble Kalman filter, the proxy flow simulation of the reservoir based on the trained DNN; assimilating new data, using the ensemble Kalman filter, by updating a current ensemble to obtain history matching through a minimization of differences between a predicted production output from the proxy flow simulation and measured production data from a field; perform, using the updated current ensemble, a second proxy flow simulation of the reservoir based on the trained DNN; repeat the assimilating and the performing while new data is available for assimilating; determining a predicted behavior of the reservoir based at least on the performed proxy flow simulation of the reservoir; and provide an indication of the predicted behavior to facilitate production of fluids from the reservoir.

A reference to an element in the singular is not intended to mean one and only one unless specifically so stated, but rather one or more. For example, "a" module may refer to one or more modules. An element proceeded by "a," "an," "the," or "said" does not, without further constraints, preclude the existence of additional same elements.

Headings and subheadings, if any, are used for convenience only and do not limit the invention. The word exemplary is used to mean serving as an example or illustration. To the extent that the term include, have, or the like is used, such term is intended to be inclusive in a manner similar to the term comprise as comprise is interpreted when employed as a transitional word in a claim. Relational terms such as first and second and the like may be used to distinguish one entity or action from another without necessarily requiring or implying any actual such relationship or order between such entities or actions.

Phrases such as an aspect, the aspect, another aspect, some aspects, one or more aspects, an implementation, the implementation, another implementation, some implementations, one or more implementations, an embodiment, the embodiment, another embodiment, some embodiments, one or more embodiments, a configuration, the configuration, another configuration, some configurations, one or more configurations, the subject technology, the disclosure, the present disclosure, other variations thereof and alike are for convenience and do not imply that a disclosure relating to such phrase(s) is essential to the subject technology or that such disclosure applies to all configurations of the subject technology. A disclosure relating to such phrase(s) may apply to all configurations, or one or more configurations. A disclosure relating to such phrase(s) may provide one or more examples. A phrase such as an aspect or some aspects may refer to one or more aspects and vice versa, and this applies similarly to other foregoing phrases.

A phrase "at least one of" preceding a series of items, with the terms "and" or "or" to separate any of the items, modifies the list as a whole, rather than each member of the list. The phrase "at least one of" does not require selection of at least one item; rather, the phrase allows a meaning that includes at least one of any one of the items, and/or at least one of any combination of the items, and/or at least one of each of the items. By way of example, each of the phrases "at least one of A, B, and C" or "at least one of A, B, or C" refers to only A, only B, or only C; any combination of A, B, and C; and/or at least one of each of A, B, and C.

It is understood that the specific order or hierarchy of steps, operations, or processes disclosed is an illustration of exemplary approaches. Unless explicitly stated otherwise, it is understood that the specific order or hierarchy of steps, operations, or processes may be performed in different order. Some of the steps, operations, or processes may be performed simultaneously. The accompanying method claims, if any, present elements of the various steps, operations or processes in a sample order, and are not meant to be limited to the specific order or hierarchy presented. These may be performed in serial, linearly, in parallel or in different order. It should be understood that the described instructions, operations, and systems can generally be integrated together in a single software/hardware product or packaged into multiple software/hardware products.

In one aspect, a term coupled or the like may refer to being directly coupled. In another aspect, a term coupled or the like may refer to being indirectly coupled.

Terms such as top, bottom, front, rear, side, horizontal, vertical, and the like refer to an arbitrary frame of reference, rather than to the ordinary gravitational frame of reference. Thus, such a term may extend upwardly, downwardly, diagonally, or horizontally in a gravitational frame of reference.

The disclosure is provided to enable any person skilled in the art to practice the various aspects described herein. In some instances, well-known structures and components are shown in block diagram form in order to avoid obscuring the concepts of the subject technology. The disclosure provides various examples of the subject technology, and the subject technology is not limited to these examples. Various modifications to these aspects will be readily apparent to those skilled in the art, and the principles described herein may be applied to other aspects.

All structural and functional equivalents to the elements of the various aspects described throughout the disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for".

The title, background, brief description of the drawings, abstract, and drawings are hereby incorporated into the disclosure and are provided as illustrative examples of the disclosure, not as restrictive descriptions. It is submitted with the understanding that they will not be used to limit the scope or meaning of the claims. In addition, in the detailed description, it can be seen that the description provides illustrative examples and the various features are grouped together in various implementations for the purpose of streamlining the disclosure. The method of disclosure is not to be interpreted as reflecting an intention that the claimed subject matter requires more features than are expressly recited in each claim. Rather, as the claims reflect, inventive subject matter lies in less than all features of a single disclosed configuration or operation. The claims are hereby incorporated into the detailed description, with each claim standing on its own as a separately claimed subject matter.

The claims are not intended to be limited to the aspects described herein, but are to be accorded the full scope consistent with the language claims and to encompass all legal equivalents. Notwithstanding, none of the claims are intended to embrace subject matter that fails to satisfy the requirements of the applicable patent law, nor should they be interpreted in such a way.

What is claimed is:

1. A method comprising:
   receiving initial input data comprising at least one of production data or geologic data related to a reservoir;
   training, using at least the initial input data and a production flow record based on the production data, a deep neural network (DNN) to model a proxy flow simulation of the reservoir;
   performing, using an ensemble Kalman filter, the proxy flow simulation of the reservoir based on the trained DNN, wherein performing the proxy flow simulation of the reservoir provides, as output, production rates and a petrophysical model;
   assimilating new data, using the ensemble Kalman filter, by updating a current ensemble to obtain history matching through a minimization of differences between a predicted production output from the proxy flow simulation and measured production data from a field;
   performing, using the updated current ensemble, a second proxy flow simulation of the reservoir based on the trained DNN;
   repeating the assimilating and the performing while new data is available for assimilation, the method further comprising:
      receiving new input data including new production data and new geologic data;
      updating, using the ensemble Kalman filter, the petrophysical model based on a covariance matrix; and
      performing, using the ensemble Kalman filter, the proxy flow simulation of the reservoir based on the trained DNN and the updated petrophysical model;
   determining a predicted behavior of the reservoir based at least on the performed proxy flow simulation of the reservoir; and
   providing an indication of the predicted behavior to facilitate production of fluids from the reservoir.

2. The method of claim 1, wherein performing, using the ensemble Kalman filter, the proxy flow simulation of the reservoir includes performing a forecast operation of the ensemble Kalman filter.

3. The method of claim 1, further comprising:
   generating, based at least in part on the received initial input data, an initial ensemble of input parameters for the proxy flow simulation, wherein the initial ensemble includes a number of realizations of the input parameters.

4. The method of claim 3, wherein the initial ensemble of input parameters comprises parameters corresponding to petrophysical properties of porosity and permeability.

5. The method of claim 3, wherein the initial ensemble is generated using a geo statistical technique.

6. The method of claim 3, wherein the initial ensemble is used as an input to the DNN.

7. The method of claim 3, wherein the proxy flow simulation based on the DNN is performed for each realization of the initial ensemble to forecast production parameters from a previous time step $t_{n-1}$ to a current time step $t_n$.

8. The method of claim 1, wherein determining the predicted behavior of the reservoir is based at least in part on the updated petrophysical model, and the predicted behavior of the reservoir predicts future oil production rate of the reservoir to facilitate management of oil production from a production well at the reservoir.

9. A system comprising:
   a processor; and
   a memory device including instructions that, when executed by the processor, cause the processor to:
      receive initial input data comprising at least one of production data or geologic data;
      train, using at least the initial input data and a production flow record based on the production data, a deep neural network (DNN) to model a proxy flow simulation of a reservoir;
      perform, using an ensemble Kalman filter, the proxy flow simulation of the reservoir based on the trained DNN, wherein to perform the proxy flow simulation of the reservoir provides, as output, production rates and a petrophysical model;
      assimilate new data, using the ensemble Kalman filter, by updating a current ensemble to obtain history matching through a minimization of differences between a predicted production output from the proxy flow simulation and measured production data from a field;
      perform, using the updated current ensemble, a second proxy flow simulation of the reservoir based on the trained DNN;
      repeat the assimilating and the performing while new data is available for assimilation, wherein the instructions further cause the processor to:
         receive new input data including new production data and new geologic data;
         update, using the ensemble Kalman filter, the petrophysical model based on a covariance matrix; and
         perform, using the ensemble Kalman filter, the proxy flow simulation of the reservoir based on the trained DNN and the updated petrophysical model;

determine a predicted behavior of the reservoir based at least on the performed proxy flow simulation of the reservoir; and provide an indication of the predicted behavior to facilitate production of fluids from the reservoir.

10. The system of claim 9, wherein to performing, using the ensemble Kalman filter, the proxy flow simulation of the reservoir includes performing a forecast operation of the ensemble Kalman filter.

11. The system of claim 9, wherein the instructions further cause the processor to:

generate, based at least in part on the received initial input data, an initial ensemble of input parameters for the proxy flow simulation, wherein the initial ensemble includes a number of realizations of the input parameters.

12. The system of claim 11, wherein initial ensemble of input parameters comprises parameters corresponding to petrophysical properties of porosity and permeability.

13. The system of claim 11, wherein the initial ensemble is generated using a geostatistical technique.

14. The system of claim 11, wherein the initial ensemble is used as an input to the DNN.

15. The system of claim 11, wherein the proxy flow simulation based on DNN is performed for each realization of the initial ensemble to forecast production parameters from a previous time step tn−1 to a current time step tn.

16. A non-transitory computer-readable medium including instructions stored therein that, when executed by at least one computing device, cause the at least one computing device to perform operations comprising:

receiving initial input data comprising at least one of production data or geologic data;

training, using at least the initial input data, a deep neural network (DNN) to model a proxy flow simulation of a reservoir;

performing, using an ensemble Kalman filter, the proxy flow simulation of the reservoir based on the trained DNN, wherein performing the proxy flow simulation of the reservoir provides, as output, production rates and a petrophysical model;

assimilating new data, using the ensemble Kalman filter, by updating a current ensemble to obtain history matching through a minimization of differences between a predicted production output from the proxy flow simulation and measured production data from a field;

performing, using the updated current ensemble, a second proxy flow simulation of the reservoir based on the trained DNN;

repeat the assimilating and the performing while new data is available for assimilating, the operations further comprising:

receiving new input data including new production data and new geologic data;

updating, using the ensemble Kalman filter, the petrophysical model based on a covariance matrix; and performing, using the ensemble Kalman filter, the proxy flow simulation of the reservoir based on the trained DNN and the updated petrophysical model;

determining a predicted behavior of the reservoir based at least on the performed proxy flow simulation of the reservoir; and providing an indication of the predicted behavior to facilitate production of fluids from the reservoir.

* * * * *

UNITED STATES PATENT AND TRADEMARK OFFICE
CERTIFICATE OF CORRECTION

PATENT NO. : 12,050,981 B2
APPLICATION NO. : 16/981080
DATED : July 30, 2024
INVENTOR(S) : Srinath Madasu et al.

Page 1 of 1

It is certified that error appears in the above-identified patent and that said Letters Patent is hereby corrected as shown below:

In the Specification

In Column 7, Line 18, after --geochemical information,-- delete "paled" and insert --paleo--

In Column 13, Line 47, after --(e.g., the stationary acoustic sensor, the moving acoustic sensor-- insert --)--

In Column 16, Line 32, after --previous time step tn-1 to a current-- delete "tune" and insert --time--

Signed and Sealed this
Eighteenth Day of March, 2025

Coke Morgan Stewart
*Acting Director of the United States Patent and Trademark Office*